United States Patent [19]
Terrell

[11] Patent Number: 5,990,412
[45] Date of Patent: *Nov. 23, 1999

[54] DIFFERENTIAL THERMOPILE HEAT FLUX TRANSDUCER FORMED BY DEPOSITING METALS AND NON-METALS FROM LIQUIDS ONTO A SUBSTRATE

[75] Inventor: James P. Terrell, Blacksburg, Va.

[73] Assignee: Vatell Corporation, Christiansburg, Va.

[*] Notice: This patent issued on a continued prosecution application filed under 37 CFR 1.53(d), and is subject to the twenty year patent term provisions of 35 U.S.C. 154(a)(2).

[21] Appl. No.: 08/647,446

[22] Filed: May 7, 1996

[51] Int. Cl.$^6$ .................................................. H01L 35/28
[52] U.S. Cl. ........................................ 136/225; 136/224
[58] Field of Search ..................................... 136/224, 225

[56] References Cited

U.S. PATENT DOCUMENTS

| | | | |
|---|---|---|---|
| 2,429,200 | 10/1947 | Bradley et al. | 136/224 X |
| 4,779,994 | 10/1988 | Diller et al. | 374/29 |
| 5,393,351 | 2/1995 | Kinard et al. | 136/224 X |

OTHER PUBLICATIONS

Flanders, S.N., "Heat Flux Transducers Measure in–situ Building Thermal Performance", *J. Thermal Insulation and Building Environments*, vol. 18, Jul. 1944, U. S. Army Cold Regions Research and Engineering Laboratory, Hanover, NH, pp. 28–52.

Trethowen, H. A., "Systematic Errors with Surface–Mounted Heat Flux Transducers and How to Live with Them", *In–Situ Heat Flux Measurements in Buildings—Applications and Interpretation of Results*, CRREL Special Report 91–Mar., 1991, U. S. Army Cold Regions Research and Engineering Laboratory, Hanover, NH, pp. 15–27.

Hager, J. M., "Development and Calibration of a Heat Flux Microsensor", *M.S. Thesis*, 1989, Virginia Polytechnic and State University, Blacksburg, VA 24061.

*Primary Examiner*—Joseph L. Felber

[57] ABSTRACT

A thin sensor for heat flux and temperature, designed for adhesive attachment to a surface, is manufactured on a flexible insulated metallic substrate, using conductive and dielectric inks. The sensor exhibits a combination of high sensitivity for heat flux and low resistance to the flow of heat. These characteristics enable it to measure heat flux at surface boundaries with improved accuracy over conventional heat flux transducers (HFT's) because the temperature drop produced by the sensor is very small. The high sensitivity of the sensor makes it ideal for measuring heat flow through insulating materials, and well adapted to instrumenting heat flow in buildings, detecting fires at an early stage, or remotely measuring the temperature of string and web products in industrial processing.

20 Claims, 8 Drawing Sheets

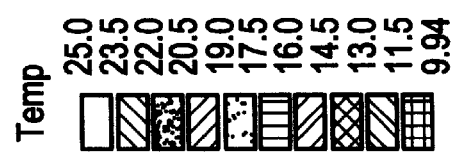
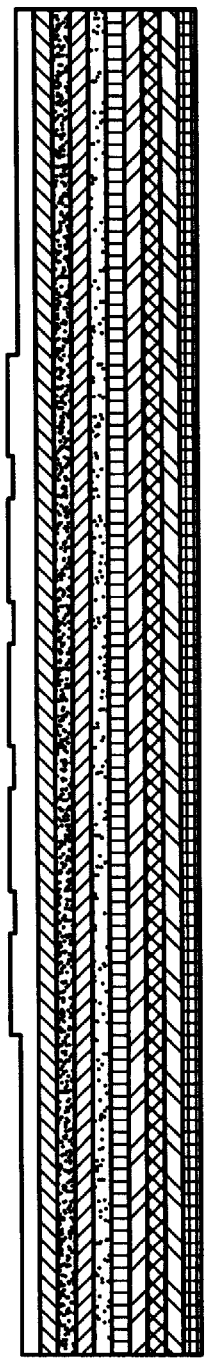
FIG.6

DIFFERENTIAL THERMOPILE HEAT FLUX TRANSDUCER FORMED BY DEPOSITING METALS AND NON-METALS FROM LIQUIDS ONTO A SUBSTRATE

BACKGROUND OF THE INVENTION

U.S. Pat. No. 4,779,994 discloses a thin film heat flux sensor and a method for manufacturing it. The manufacturing method has certain drawbacks which limit the sensor performance and restrict the range of applications. The manufacturing cost of the sensor is high because it is made by multiple stages of sputtering through shadow masks. Another drawback is the relatively low sensitivity of the sensor; heat flux is measured by measuring the temperature drop across a very small thermal resistance, and signals are of the order of a few microvolts per watt/cm$^2$. In many applications for such sensors, heat flows to be measured are a small fraction of 1 watt/cm$^2$, and thin film sensors cannot be used.

A heat flux sensor indicates the rate and direction of heat energy flow. When the measurements of such a sensor are combined with those of a temperature sensor at the same location, all of the following quantities are indicated:

(a) the present temperature;

(b) the present heat flux;

(c) the heat transfer coefficient;

(d) the effective thermal capacity;

(e) the projected rate of temperature change at the present heat flux; and (f) the projected rate of temperature change at any other value of heat flux.

In addition, the temperature and heat flux signals can be compared to detect drift or failure of either sensor.

Measurement of heat flux is critical to the understanding or control of many thermal systems. When both heat flux and temperature data are available for the same point on a surface, one can calculate such material properties as thermal resistance and thermal diffusivity. In situ measurement of heat flux is essential for the performance evaluation of insulative building materials. This is because it is often difficult or impossible to predict the installed performance of insulative materials from laboratory experiments.

Heat flux transducers (HFT's) have been used in building energy management applications since the 1950's. Methods for using them to evaluate the thermal performance of building materials are generally well understood. HFT's designed for surface mounting are inexpensive and easy to install. However, it is often difficult to acquire accurate, useful data with them.

The heat flux through a surface cannot be measured without some disturbance caused by insertion of the measuring device into the path of heat flow. The amount of change produced by the measuring device depends on many factors. These include; the contact resistance between the HFT and the test wall and other physical parameters such as surface emissivity, surface roughness and the thermal resistance of the HFT itself. These factors comprise the effective series thermal resistance, $R_m$ defined by $$R_m = R_h + R_c + (R_{ms} - R_s) \quad (1)$$

Where:

$R_m$ = effective series thermal resistance $R_h$ = series thermal resistance (conductive) of the HFT alone $R_c$ = thermal contact resistance between HFT and substrate $R_{ms}$ = total thermal surface resistance (convective and radiative) over HFT $R_s$ = total thermal resistance (convective and radiative) over surrounding area The effective series resistance of a surface mounted HFT is the most important single factor affecting the error produced by disturbance of the measured heat flux. If $R_{ms}$ and $R_s$ are made approximately equal by matching the emissivity and the surface roughness of the HFT to corresponding values for the surrounding material, the effective series resistance is reduced to the sum of the HFT series thermal resistance and the thermal contact resistance. The series thermal resistance can vary widely in commercially available surface mounted HFT's; from about 0.002 m$^2$ °C./W to 0.1 m$^2$ °C./W. The thermal contact resistance is minimized by attaching the sensor to the surface with a very thin layer of high thermal conductivity adhesive.

For maximum utility in building energy management, a heat flux sensor should have a series thermal resistance of less than $1 \times 10^{-4}$ m$^2$ °C./W. However, when the series thermal resistance of a thermopile type HFT is very low, its sensitivity may also be low because the low thermal resistance only produces a small temperature difference.

Another factor which affects the utility of a heat flux sensor in building energy management is shunting of heat flux around the sensor. Shunting can be significantly reduced by increasing the dimensions of a sensor. This solves the problem because the thermal resistance of the path around the sensor is directly proportional to the distance the heat travels. Large area HFT's can also provide more accurate data over non-homogeneous areas, such as across wall studs in framed buildings or on truss roofs. A large surface mounted HFT averages out the effects of such features. Unfortunately large HFT's are very expensive. According to a recent survey, the typical cost of a commercially available 12"×12" HFT is over $600.00.

The copper conductors of printed circuit boards are produced by a number of processes. The most common of these is photoetching. In this process a board completely coated with copper and covered by a photopolymer is exposed to ultraviolet light through a negative transparency of the desired conductor pattern, solvent washed to remove the polymer where it has not been hardened by exposure, and then acid etched to expose the desired conductors.

A second process for producing printed circuit boards, known as the additive process, consists of a first step of electroless deposition of a very thin nickel layer representing the desired conductor pattern, followed by a second step of electrolytic deposition of the desired thickness of copper on the nickel conductors.

There is a lesser known third process for making printed circuit boards. In this process conductors are deposited as inks on an insulating substrate by screen printing. The ink traces are dried to a solid by rapid heating in a vapor reflow oven, then converted to metal by an elevated heat treatment. This process could be adapted to heat flux sensor manufacturing, if it could be used to deposit conductors of two different metals in an appropriate pattern.

BRIEF DESCRIPTION OF THE DRAWINGS

FIG. 6 shows a model of the temperature distribution through the thickness of the HFT and the wall it is attached to.

DETAILED DESCRIPTION OF THE INVENTION

Figure 1:
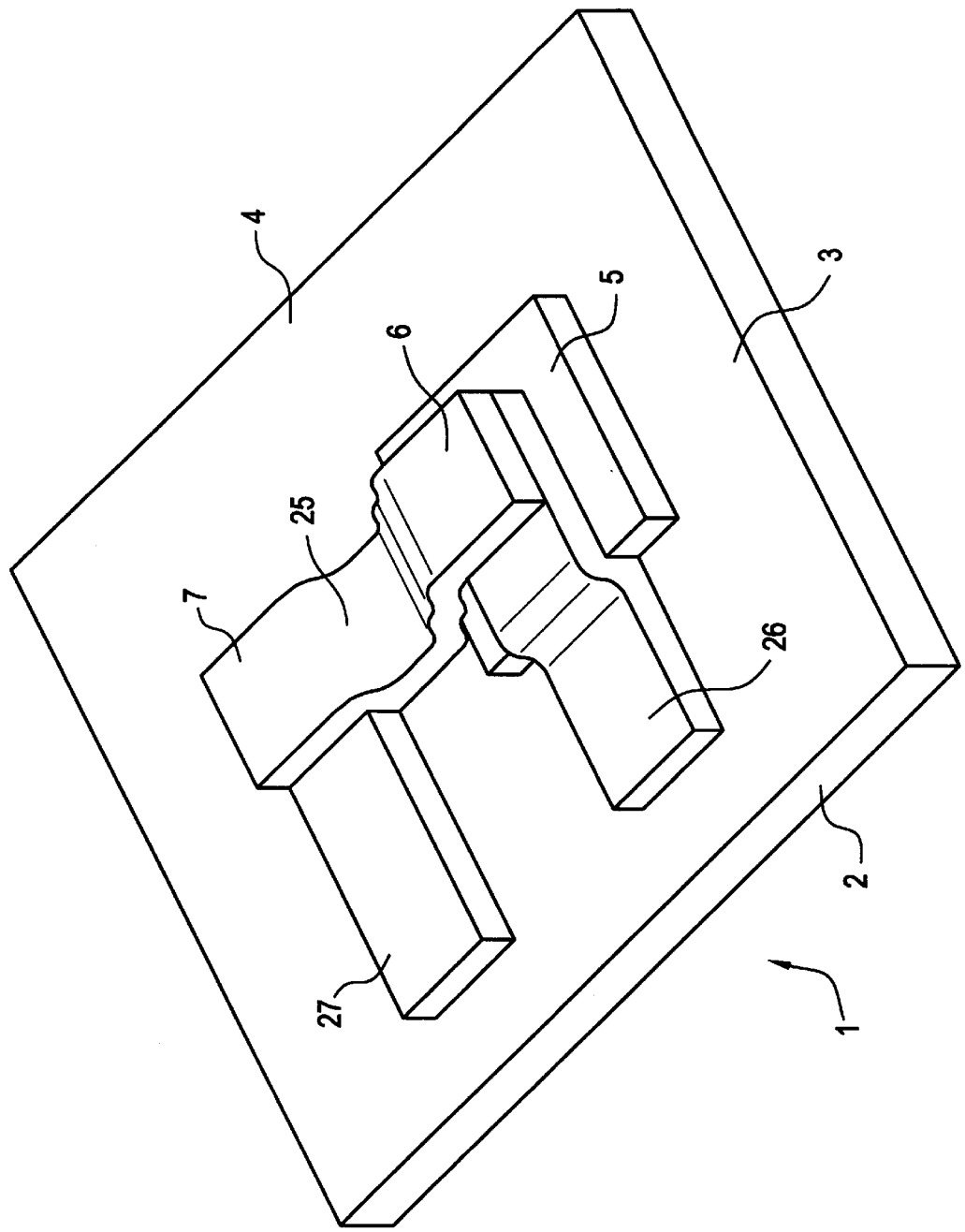
FIG. 1 is an isometric view of an elementary heat flux sensor comprising a single thermocouple pair, formed on a thin sheet of anodized aluminum.

FIG. 1 shows an elementary heat flux sensor 1 constructed according to the invention. The sensor consists of a thin sheet of aluminum 2 which has been anodized on at least one surface 3. Anodization produces a thin aluminum oxide layer 4 to electrically insulate the sensor elements from the aluminum. This layer is thin enough to allow heat to flow through the sensor with little resistance. A part of the anodized layer 4 of the sheet 2 is coated with a polymeric insulating pad 5. This pad locally increases resistance to the flow of heat through the portion of the surface it covers. A copper signal electrode 26 is deposited partly on top of the insulating pad 5 and partly on the aluminum oxide layer 4. A copper reference electrode 27 is deposited entirely on the aluminum oxide layer 4. One end of a nickel crossover electrode 25 overlaps the part of the copper signal electrode which is on top of the insulating pad 5, forming a first thermocouple junction 6. The other end overlaps the copper reference electrode, forming a second thermocouple junction 7.

Figure 2:
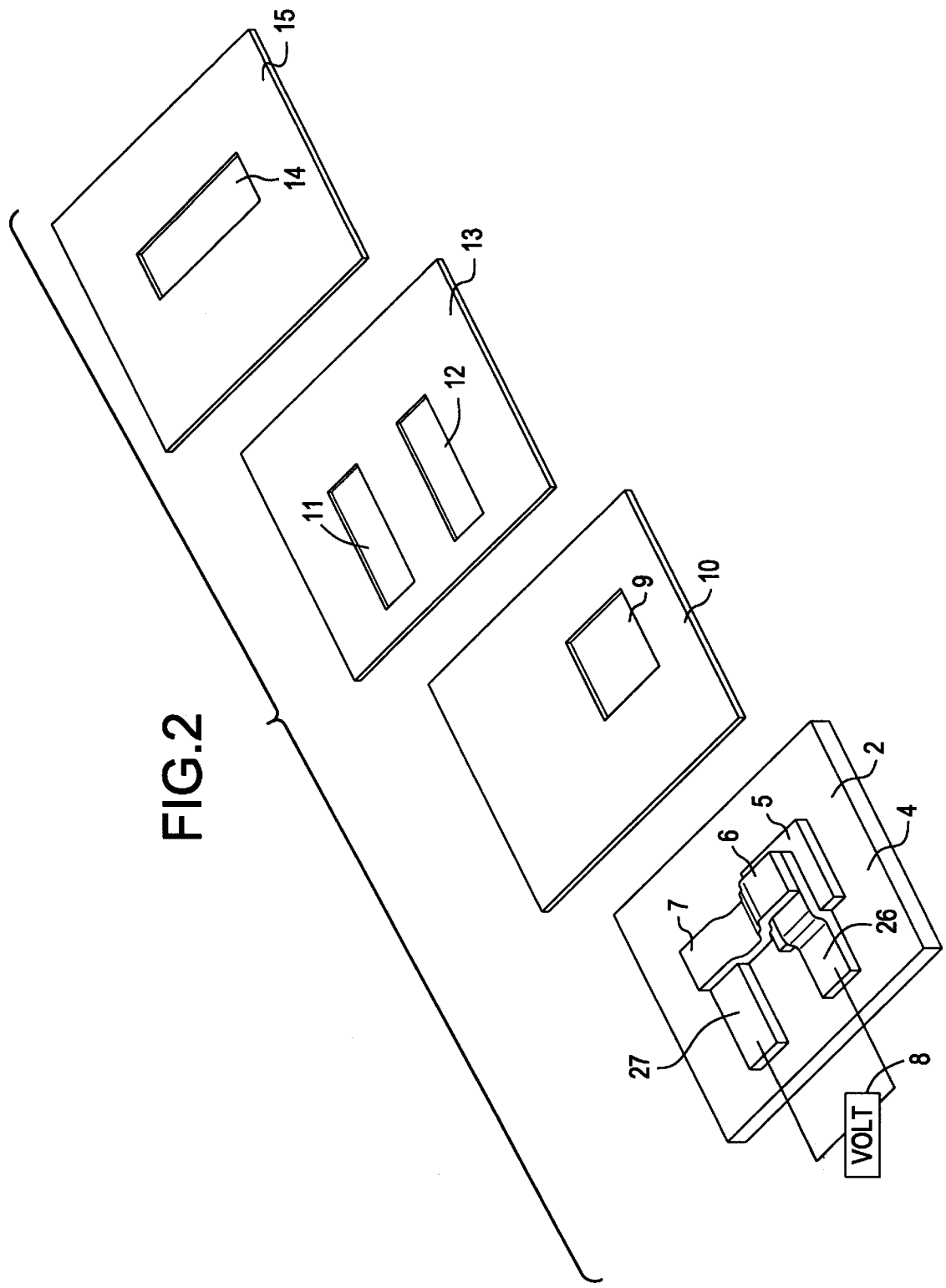
FIG. 2 is an isometric view of an elementary heat flux sensor comprising a single thermocouple pair, shown together with the masks used in its fabrication.

Certain steps in the construction of this elementary heat flux sensor are depicted in FIG. 2. The aluminum sheet 2 is prepared by anodization, a process which exposes the metal surface to an oxidizing acid in an electrolytic tank. The oxide layer 4 built up by this process is dense and has very good electrical insulating qualities. After the aluminum is anodized, the insulating pad 5 is deposited on its insulated surface by silk-screening of an ink containing a polymer dielectric. The ink is deposited on the surface through an aperture 9 in a first silk screen 10, and then dried and heat-cured to produce the solid insulating pad 5. The next step is to apply a copper-containing ink through apertures 11 and 12 in a second silk screen 13, This step produces the copper signal electrode 26 and the copper reference electrode 27. ink through aperture 14 in a third silk screen 15, followed by drying and heat-curing. This completes the heat flux sensor by creating thermocouple junctions 6 and 7. The copper electrodes of the two thermocouples are connected to a voltage measuring instrument 8, providing a direct indication of heat flux.

The elementary heat flux sensor operates as follows. When heat flows through the substrate from its top to its bottom surface, a difference in temperature develops between thermocouples 26 and 27. This occurs because the total resistance of the heat path through the aluminum sheet and the polymeric insulating pad 5 is greater than that through the aluminum sheet alone. The temperature difference will persist as long as the heat continues to flow. The thermocouple 26 located on the insulating pad 5 will be slightly hotter than thermocouple 27. This difference in temperature will produce a small positive voltage across the copper electrodes of the sensor, and the voltage will be sensed by the voltage measuring instrument 8. The magnitude of the voltage is proportional to heat flux through the sensor because the difference in thermocouple temperatures is proportional to heat flux.

If the heat flux direction is reversed, the temperature of the thermocouple 26 will be lower than that of thermocouple 27, and the polarity of the signal will be reversed. Thus the polarity of the signal indicates the direction of heat flow.

Figure 8:
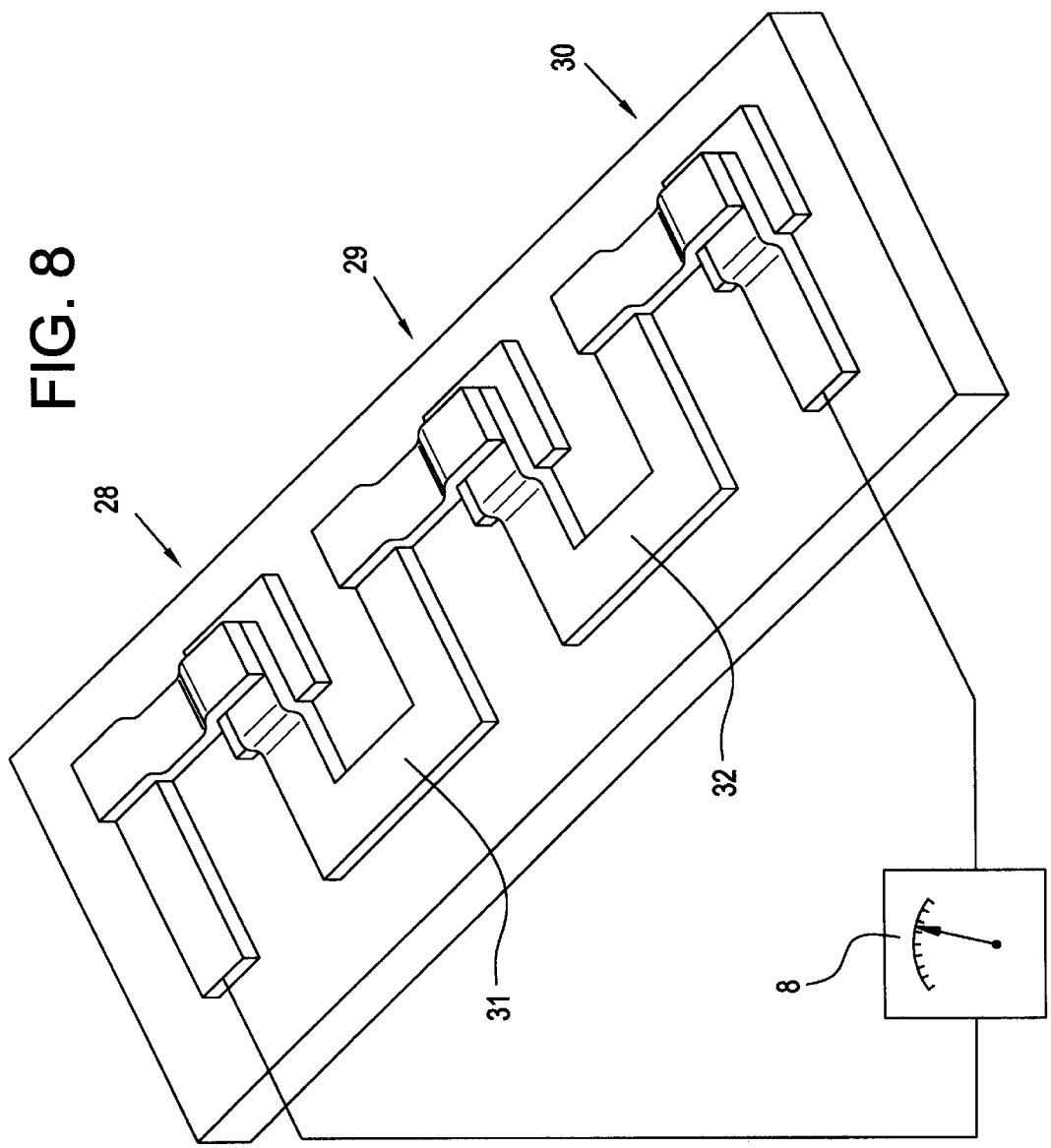
FIG. 8 is an isometric view of three elementary heat flux sensors, deposited on a single substrate and connected in series to produce three times the output voltage of a single sensor.

The magnitude of the voltage signal produced by the elementary heat flux sensor is very small. Typically the temperature difference across the insulating pad 5 will be a fraction of a degree centigrade, and the signal produced by the opposed potentials of the two thermocouples will be a few microvolts, not enough for accurate measurements in real applications. To produce a more useful signal, a sensor may be constructed of many elementary heat flux sensors, connected in a series arrangement which adds their voltages together. FIG. 8 illustrates a series combination of three elementary heat flux sensors 28, 29 and 30 connected in this manner to produce three times the output voltage of a single sensor. The copper signal electrode of sensor 28 and the copper reference electrode of sensor 29 are interconnected by a copper link 31. The copper signal electrode of sensor 29 and the copper reference electrode of sensor 30 are interconnected by a copper link 32. A voltmeter 8 is connected between the copper reference electrode of sensor 28 and the copper signal electrode of sensor 30. This series combination of three elementary sensors may be deposited in the same manner as a single elementary sensor, using a first silk screen for all the polymer dielectric pads, a second silk screen for all the copper electrodes and their connections, and a third silk screen for all the nickel crossover electrodes. This technique may be expanded to the deposition of a series arrangement of thousands of elementary sensors, as shown in FIG. 3.

Figure 3:
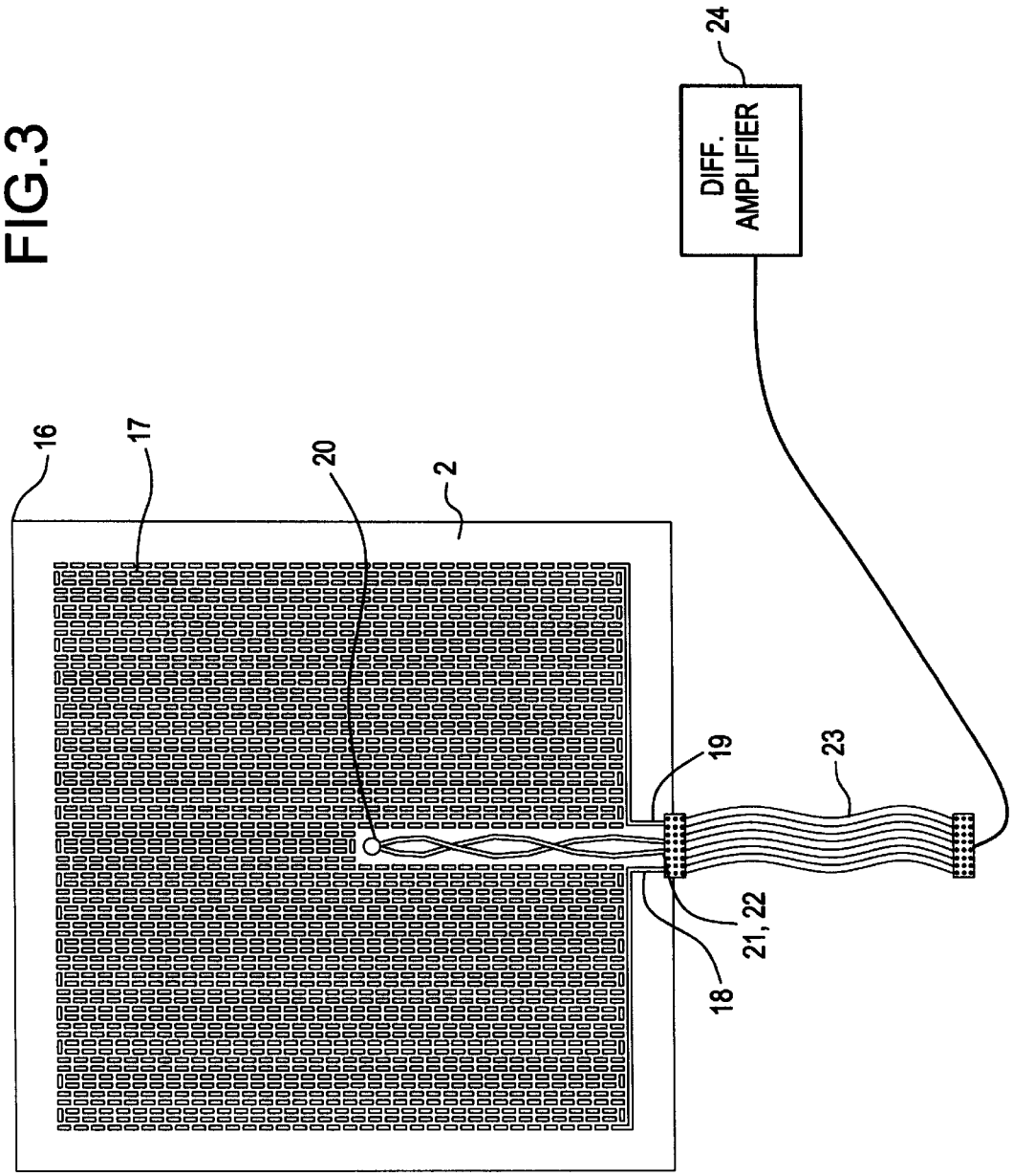
FIG. 3 shows an arrangement of many elementary heat flux sensors on a thin sheet of anodized aluminum, which, together with a thermocouple, comprise a heat flux transducer.

FIG. 3 shows a heat flux transducer 16, fabricated using dielectric and conductive inks according to the invention. The HFT is fabricated on a thin sheet of aluminum 2 which has been anodized over its entire top surface to electrically isolate the sensor elements. The heat flux sensor 17 comprises a series connected array of 2000 elementary heat flux sensors as shown in FIG. 1. The ends of this array terminate in connection leads 18 and 19. An individual wire thermocouple 20 is bonded to the top surface of the aluminum sheet 2, and its connection leads 21 and 22 are located between the leads 18 and 19 of the heat flux sensor 17. Thermocouple 20 provides an independent measurement of temperature at the top surface of the aluminum sheet 2. This measurement may be used for temperature compensation of the heat flux signal, or to calculate the heat transfer coefficient of the sensor assembly Each of the four connection leads is connected to a wire of the flat cable 23, which carries the signals of the HFT to an amplifier 24.

To employ the HFT of FIG. 3 for measurements, the surface whose heat flux and temperature are to be measured is prepared with a thin layer of adhesive, such as Duro All-Purpose Spray Adhesive, distributed by Loctite Corporation. The HFT is then pressed flat onto the prepared surface with the heat flux sensor 17 and thermocouple 20 side facing out. Then the flat cable 23 is connected to the amplifier 24, and measurements can begin.

The thick film conductors used in the sensor of the invention are conductive copper and nickel inks. These inks, as well as methods for their deposition and curing, were developed by Toronaga Technology Inc. The nickel ink was developed under a contract to the inventor's employer. Prior to the current invention, only the copper ink had been used, in printed circuit board fabrication and EMI suppression. No other application had been found for the nickel ink.

DEVELOPMENT OF THE INVENTION

The inventor contacted Toronaga Technology Inc. and inquired about the availability of inks for metals other than copper. He was told that a nickel ink could be produced, but it was not yet perfected. Toronaga was not aware of any applications for such an ink. After having them sign a confidentiality agreement, the inventor described how a heat flux sensor could be made with copper and nickel inks, if after deposition by screen printing and heat-curing they would produce a thermocouple. Toronaga agreed to make a test thermocouple by overlaying the ends of some copper and nickel conductors on a plastic substrate. This experiment was a success: the output voltage of the thermocouple was more than ⅓ of the output of a solid thermocouple made of the same metals.

Toronaga then agreed to produce a quantity of the nickel ink sufficient for fabrication of some test heat flux sensors, and to produce the sensors themselves under a development contract. Four different anodized aluminum substrates were forwarded to Toronaga, along with simple pattern masks for evaluating adhesion and isolation of the inks. The substrates were 0.010" 1100-H18 aluminum with clear anodization and 0.01" 1100-H18 with hard anodization, 0.032" 5052 aluminum with the clear coating and 0.032" 5052 with the hard coating.

Two 0.25" square pads of each of the three inks were printed on each of the substrates, 6 pads in all, to evaluate electrical isolation of the conductive inks from the substrates and test adhesion of the inks to the substrates. All of the inks adhered satisfactorily. The hard anodization on both types of aluminum exhibited more microcracking than the clear coatings. Microcracks in the anodization layer could result in electrical shorting of the conductive inks to the substrate. The 1100-H18 aluminum tended to de-laminate at the edges during the curing stages. For these reasons, 5052 aluminum with a clear anodization was chosen as the substrate for the remainder of the tests.

Toronaga recommended a polymer ink, Ormeply 100, to be used for the thermal resistance layers. They printed pads of this ink on 0.002" thick stainless steel shim stock and the inventor submitted these samples to another supplier, Holometrix, for thermal property determinations. The thickness of the Ormeply 100 ink samples was measured at 0.018 mm., using a profilometer. Two 1.3 cm. diameter disks were machined out of each of the two Ormeply 100 coated aluminum substrates and sent to Holometrix. The results of their thermal properties measurements are tabulated below.

| Sample | Density (g/cm$^3$) | Temp.(C.) | $C_p$ (J/gK) | $\alpha$ (cm$^2$/s) | k (W/mK) |
|---|---|---|---|---|---|
| Ormeply 100 | 1.16 | 25 | 1.25 | 0.00164 | 0.238 |

The thermal conductivity (0.238 W/mK) measured by Holometrix does not agree with the thermal conductivity calculated (0.07 W/mK) from the measured thermoelectric potential of the copper/nickel ink thermocouple and the measured thickness of the dielectric ink. Reasons for the discrepancy are unknown.

The inventor designed a sensor pattern with 66 thermocouple pairs, and supplied masks to Toronaga for all the sensor layers. The conductor leads in the pattern were 0.10" wide and the dielectric thermal insulation pads were 0.20" square. The overall size of the sensor was approximately 3"×3". Toronaga subcontracted fabrication of the sensor pattern screens to a silk-screen manufacturer. The screens were 230 mesh, which would have allowed a much smaller minimum line width of 0.2 mm., depositing a metal thickness of 0.04 mm.

Three sensors were printed by Toronaga on 0.025 cm thick 5052 aluminum shim stock with clear anodization. The sensors were labeled #1, #2 and #3. Sensors #1 and #2 had 0.005 cm dielectric thermal insulation layers while sensor #3 had a 0.0025 cm thick layer. The two thicknesses were chosen to explore the relationship between the dielectric thickness and the sensitivity. The three sensors were evaluated for continuity, substrate isolation, breakdown voltage and preliminary sensitivity. The sensitivity was approximated by comparing the sensor outputs to that of a standard Gardon sensor using radiative heat flux produced by a 200 watt Research Incorporated spot heater. The heat flux level was approximately 0.1 W/cm$^2$. The preliminary sensitivities and other measured values for the three sensors are tabulated below.

| Sensor # | Resistance (ohms) | Isolation (ohms) | Breakdown Voltage (V) | Sensitivity (mV/W/cm$^2$) |
|---|---|---|---|---|
| 1 | 3.38 | >300 MΩ | >350 V | 2.033 |
| 2 | 3.11 | >300 MΩ | >350 V | 1.600 |
| 3 | 3.12 | 80 MΩ | >350 V | .992 |

Figure 4:
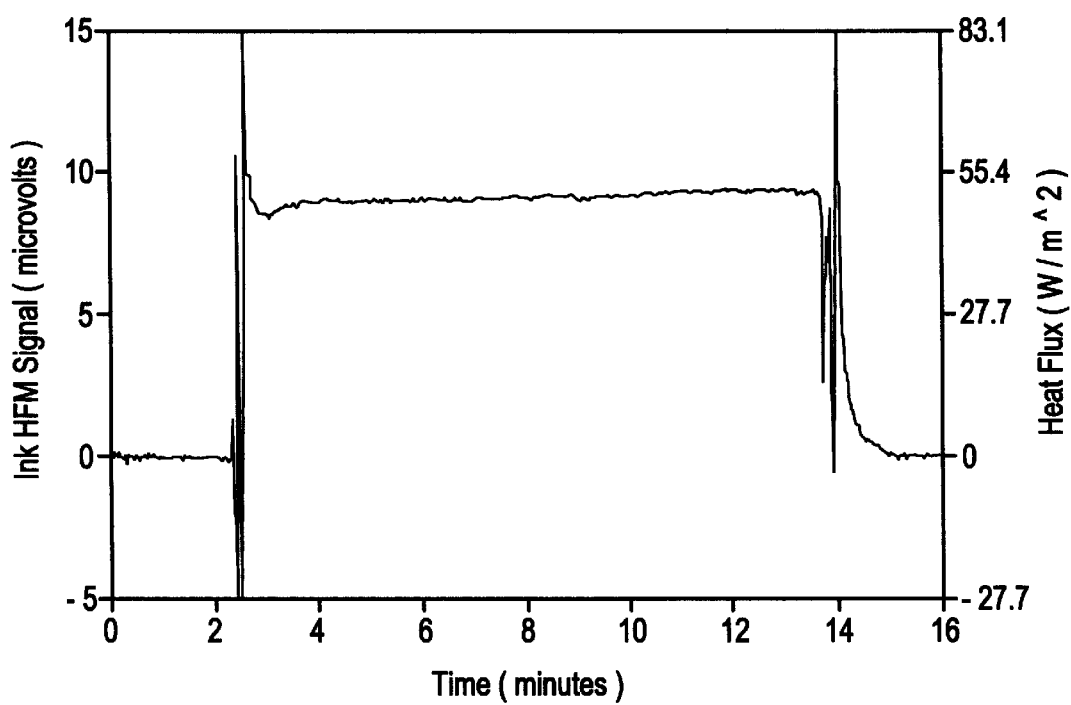
FIG. 4 is a record of the transducer signals during an R-Matic calibration cycle.

The three sensors were also calibrated in an R-Matic guarded hot plate manufactured by Dynatech in Cambridge Mass. The R-Matic system was allowed to stabilize for 24 hours before any testing was performed. Two pieces of 1.27 cm thick, 61 cm×61 cm thermal insulation were placed in the hot plate. With the insulation installed, the hot side of the device was allowed to stabilize at 38° C. and the cold side at 10° C. A Hewlett-Packard signal analyzer was used to acquire data. The sensor was first placed between two pieces of insulation outside the apparatus to check the signal with zero heat flux. After a few minutes of zero flux to establish a base line signal the sensor was placed in the hot plate apparatus, between the installed insulation, while data acquisition continued. The system was allowed to stabilize for several minutes and then the sensor was removed from the hot plate. The total signal, shown in FIG. 4, resembles a step input from zero to a constant heat flux and back to zero. For calibration, this signal was compared to the heat flux reading from the R-Matic system. Noise spikes are produced during the insertion and removal of the sensor. These few seconds of date are not included in the analysis. The calibration results are tabulated below.

| Sensor # | HFS Unamplified ($\mu$V) | R-Matic (mV) | R-Matic HF (W/cm$^2$) | Sensitivity (mV/W/cm$^2$) |
|---|---|---|---|---|
| 1 | 7.74 | 3.16 | 4.65 × 10$^{-3}$ | 1.64 |
| 2 | 9.00 | 2.95 | 4.39 × 10$^{-3}$ | 2.05 |
| 3 | 4.65 | 3.06 | 4.56 × 10$^{-3}$ | 1.02 |

Comparing the sensitivities measured by the two calibration methods it would seem that sensors #1 and #2 have been switched. However, this is not the case. A close agreement of the two calibration methods was not expected since the radiation calibration was not well controlled. The sensor substrate was not attached to a heat sink and the irradiated face was not coated with a high emissivity coating. The radiation calibration was performed merely to obtain an approximate sensitivity.

NUMERICAL MODELING

A small section of the proposed sensor was numerically modeled in two dimensions using the Cosmos finite element modeling package. The temperature distribution perpendicular to the surface was studied with simulated exposure to both radiative and convective heat flux. The lateral temperature distribution and the amount of heat flux shunting around the sensor were analyzed as functions of test wall material and sensor mounting method.

Figure 5:
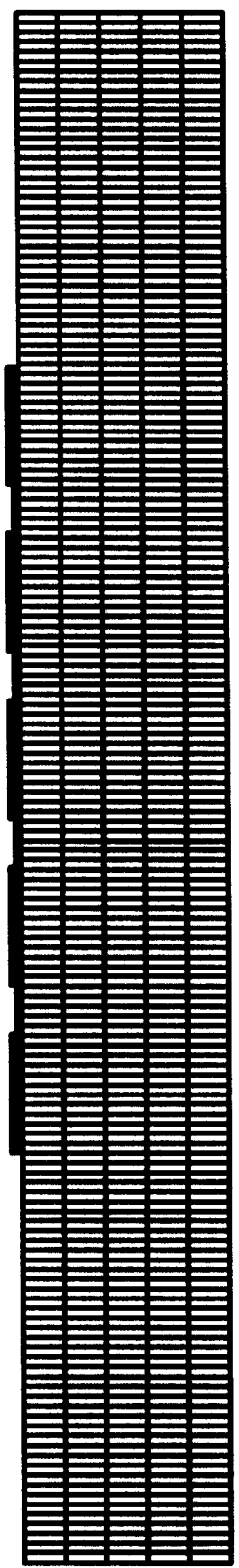
FIG. 5 shows a two dimensional thermal model of the transducer.

The 2-D model is shown in FIG. 5. The vertical scale of the sensor has been exaggerated to show detail. Boundary conditions creating the convective heat flux are a convection coefficient of 10 W/cm$^2$K on the top surface, a forced constant temperature along the bottom surface of the test wall of 25° C. and an ambient temperature of 35° C. Two test walls were studied with these boundary conditions; regular gypsum board with a thermal conductivity of 0.0017 W/cmK and thickness of 1 cm, and plate glass with a thermal conductivity of 0.014 W/cmK also with a thickness of 1 cm. Each of these test walls was simulated with and without a 0.0025 cm layer of mounting adhesive having a thermal conductivity of 0.0014 W/cmK, between the substrate back and the test wall. In the cases without adhesive the thermal contact between the test wall and substrate is assumed perfect. Heat flux shunting around the numerical sensor caused by the additional thermal resistance was analyzed for these cases. FIG. 6 shows the temperature distribution through the sensor and test wall. The modeling results tabulated below show the percent difference of heat flux flowing through the mounted sensor and the undisturbed wall.

| Test Wall Material | Adhesive Present | Heat Flux - Undisturbed Wall (W/cm$^2$) | Heat Flux - Sensor and Wall (W/cm$^2$) | % Difference |
|---|---|---|---|---|
| Gypsum | No | .0170 | .01695 | 0.30 |
| Gypsum | Yes | .0170 | .01690 | 0.60 |
| Plate Glass | No | .1400 | .1389 | 0.73 |
| Plate Glass | Yes | .1400 | .1355 | 3.2 |

The difference in heat flux shown in the last column is essentially the change in thermal resistance with and without the adhesive present.

Figure 7:
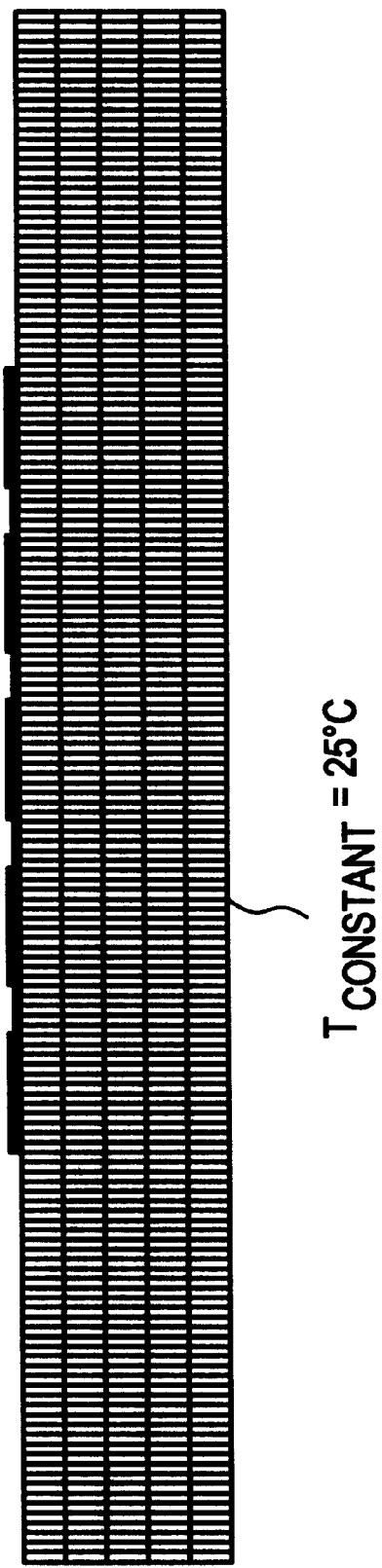
FIG. 7 shows boundary conditions for modeling of the transducer.

The boundary conditions creating the radiative heat flux are shown in FIG. 7. A constant temperature surface at 225° C. is located a small distance away from the sensor face, giving a view factor ≈1.0 between the two surfaces. All communicating surfaces were assumed to have an emissivity of 0.95 and the back surface of the test wall was given a constant temperature of 25° C. The radiative heat flux results are shown in the table following.

| Test Wall Material | Adhesive Present | Heat Flux - Undisturbed Wall (W/cm$^2$) | Heat Flux - Sensor and Wall (W/cm$^2$) | % Difference |
|---|---|---|---|---|
| Gypsum | Yes | .1800 | .1799 | .0722 |
| Plate Glass | Yes | .2759 | .2750 | .3300 |

To reduce electrical pickup by leads of the heat flux sensor, shielded leads were used to connect signals to the amplifier and the shield was electrically connected to the aluminum substrate by grinding through a section of the anodized layer and grounding the shield to the substrate with conductive tape. Five additional HFT's were made in this manner, and these units were calibrated in the guarded hot plate. After calibration, each sensor was then placed between the pieces of thermal insulation outside the hot plate to recheck the zero for heat flux. The calibration results for these five sensors are shown in the following table.

| Sensor # | HFS Unamplified ($\mu$V) | R-Matic (mV) | R-Matic HF (W/cm$^2$) | Sensitivity (mV/W/cm$^2$) |
|---|---|---|---|---|
| 4 | 10.60 | 3.07 | 4.56 × 10$^{-3}$ | 2.20 |
| 5 | 9.55 | 3.08 | 4.58 × 10$^{-3}$ | 2.08 |
| 6 | 10.29 | 3.06 | 4.56 × 10$^{-3}$ | 2.26 |
| 7 | 10.08 | 3.09 | 4.61 × 10$^{-3}$ | 2.19 |
| 8 | 9.12 | 3.05 | 4.54 × 10$^{-3}$ | 2.01 |

The measured sensitivities are much greater than the predicted value. The predicted sensitivity is 0.6 mV/W/cm$^2$, calculated using the following equation.

$$S = (\text{Number of } TC's) \times (Pot.) \times \left(\frac{\Delta x}{\kappa}\right)$$

Where;

Number of $TC$'s 66

Pot. Thermoelectric Potential of Cu/Ni Ink $TC = 4.2\ \mu V/°C$.

$\Delta x$ Dielectric Ink Thickness = $5.08 \times 10^{-3}$ cm $\kappa$ Thermal Conductivity = $.00238\ W/cmK$ The reason for the 3:1 discrepancy is unknown, but it was probably a result of the method used for preparation of the thermal conductivity sample for Holometrix, or the procedure followed in the measurement.

FEATURES OF THE INVENTION

Heat flux transducers made according to the invention have excellent performance characteristics and are reasonable in cost. If the full resolution of the available ink screen printing process is utilized, the following design and performance specifications can be met for an HFT to be used in building materials evaluation.

| | |
|---|---|
| Substrate | 0.25 mm thick anodized 5052 aluminum |
| Size | 5 cm square |
| Overall thickness | 0.33 mm |
| Sensitivity | 6.0 $\mu$V/W/m$^2$ |
| Minimum detectable heat flux | .17 W/m$^2$ |
| Time response | Approx. 5 msec for 63% of maximum signal |
| Flexibility | 7.0 cm minimum cylinder radius |
| Maximum temperature | 250° C. |
| Leads | 30 cm shielded flat conductor |
| Mounting | Attach to any surface with adhesive spray. |

The transducer of the invention combines good heat flux sensitivity with very low resistance to heat flow and rapid time response. These attributes make it useful in measuring the properties of insulation and other building materials, both in the laboratory and in situ. The transducer's low thermal resistance reduces the change in heat flux that is caused by introduction of the transducer into the heat flow path, and improves measurement accuracy. Its high sensitivity improves the resolution of measurements, and its rapid response allows measurements to be made on dynamic systems.

Although the preferred embodiment described above is a flexible transducer designed for adhesive surface application, the same screen-printing methods and materials can be used to apply heat flux sensors to rigid objects. These sensors can be used to measure conductive, radiative and convective heat flux for a variety of purposes. For example, they may be used to remotely sense the temperature of a heated object which radiates energy to the sensor, or which absorbs energy radiated by the sensor. U.S. patents which illustrate this application are U.S. Pat. Nos. 5,154,512 and 5,318,362 issued to Schietinger et-al, and U.S. Pat. Nos. 5,216,625 and 5,294,200 issued to Rall. In these systems the high sensitivity of the transducer will facilitate remote measurements of temperature with finer discrimination, and at greater distances. The rapid response of the transducer will make it possible to control product temperature more precisely and rapidly.

Screen-printed ink sensors can ultimately be made by an inexpensive, automated process. Multiple HFT's can be printed on a single sheet and then cured and later diced into individual sensors. Any size of printed HFT can be constructed by mounting units side by side and connecting them in series to produce a single heat flux signal.

I claim:

1. A differential thermocouple pair heat flux sensor comprising:
    (a) an electrically insulating substrate made of a material which has high thermal conductivity;
    (b) a thin raised pad of thermally insulating material covering a small part of the surface of said substrate;
    (c) a thin signal electrode of a first metal with a first end partially overlapping the surface of said thin raised pad and a second end extending over part of the surface of said substrate;
    (d) a thin reference electrode of said first metal on the surface of said substrate;
    (e) a thin crossover electrode of a second metal with a first end extending over and electrically contacting the part of the surface of said signal electrode which extends over said thin raised pad and a second end extending over and electrically contacting part of the surface of said reference electrode;
    (f) said crossover electrode, said signal electrode and said reference electrode forming a differential thermocouple pair which responds to heat energy flowing through the surface of said substrate by producing a voltage between said signal electrode and said reference electrode;
    (g) each of said electrodes being formed by deposition from a liquid.

2. The sensor of claim 1 in which said electrically insulating substrate is formed from a metal by coating one of its surfaces with a thin layer of an electrically insulating material.

3. The sensor of claim 2 in which said substrate is formed of aluminum and said electrically insulating material is aluminum oxide formed by an anodic oxidation process.

4. The sensor of claim 3 in which the aluminum of said substrate is in the form of a flexible sheet.

5. The sensor of claim 1 in which said thin raised pad is formed by deposition from a liquid.

6. The sensor of claim 1 in which said liquids are metal-containing inks.

7. The sensor of claim 1 in which said first metal and said second metal have Seebeck coefficients of opposite polarities.

8. The sensor of claim 1 in which said first metal is nickel and said second metal is copper.

9. The sensor of claim 1 in which said first metal is copper and said second metal is nickel.

10. The sensor of claim 1 in which said deposition consists of screen printing followed by drying and heat treatment to precipitate and fuse metal from said liquid.

11. The sensor of claim 1 in which said substrate is formed of a thin sheet of aluminum having a surface coating of aluminum oxide formed by an anodic oxidation process, and said liquid from which each electrode is deposited is a metal-containing ink deposited by screen-printing followed by drying and heat treatment.

12. A layered heat flux sensor comprising:
    (a) a substrate made of an electrically insulating material which has high thermal conductivity;
    (b) a first thermocouple comprising two layers of dissimilar metals in close thermal contact with said substrate;
    (c) a second thermocouple comprising two layers of said dissimilar metals;
    (d) means for thermally isolating said second thermocouple from said substrate;
    (e) wherein said first and said second thermocouples are electrically interconnected to form a differential thermopile; and said dissimilar metals are deposited from liquids.

13. The sensor of claim 12 in which said substrate is formed from a metal having one of its surfaces coated with a thin layer of an electrically insulating material.

14. The sensor of claim 12 in which said means for thermally isolating said second thermocouple consists of thin raised pads formed by deposition from a liquid.

15. The sensor of claim 12 in which said liquids are metal-containing inks.

16. The sensor of claim 12 in which said dissimilar metals are nickel and copper.

17. The sensor of claim 12 in which said thermocouples consist of metals which are screen printed, dried and heat treated to precipitate and fuse metal from said liquid.

18. The sensor of claim 12 in which said substrate is formed of aluminum and is electrically insulated by an anodic oxidation process.

19. The sensor of claim 18 in which the aluminum of said substrate is in the form of a flexible sheet.

20. The sensor of claim 12 in which said substrate is formed of a thin sheet of aluminum and electrically insulated by an anodic oxidation process, and said liquids are metal-containing inks deposited by screen-printing followed by drying and heat treatment.

\* \* \* \* \*